United States Patent [19]

Jeffers

[11] Patent Number: 5,418,458

[45] Date of Patent: May 23, 1995

[54] APPARATUS AND METHOD FOR AUTHENTICATION OF DOCUMENTS PRINTED WITH MAGNETIC INK

[75] Inventor: Frederick J. Jeffers, Escondido, Calif.

[73] Assignee: Eastman Kodak Company, Rochester, N.Y.

[21] Appl. No.: 114,720

[22] Filed: Aug. 31, 1993

[51] Int. Cl.⁶ .............. G01N 27/80; G01N 27/84; G07D 7/00; G06K 7/08

[52] U.S. Cl. .................... 324/235; 235/450; 235/449; 194/213; 324/226; 324/228; 209/534

[58] Field of Search .......... 324/214, 227, 228, 222, 324/223, 235, 207.21, 262, 232, 226; 235/449, 450; 194/210, 213; 209/534

[56] References Cited

U.S. PATENT DOCUMENTS

| | | | |
|---|---|---|---|
| 3,599,153 | 8/1971 | Lewis et al. | 235/449 |
| 4,038,596 | 7/1977 | Lee | 255/449 |
| 4,617,458 | 10/1986 | Bryce | 235/449 |
| 4,764,725 | 10/1988 | Bryce | 324/228 X |
| 4,837,426 | 6/1989 | Pease et al. | 235/440 |
| 4,906,988 | 3/1990 | Copella | 340/825.34 |
| 4,985,614 | 1/1991 | Pease et al. | 235/440 |
| 5,014,325 | 5/1991 | Moritomo | 382/7 |
| 5,068,519 | 10/1991 | Bryce | 324/223 |
| 5,091,961 | 2/1992 | Baus, Jr. | 235/449 |
| 5,196,681 | 3/1993 | Mantegazza | 235/449 |

Primary Examiner—Sandra L. O'Shea
Assistant Examiner—Roger C. Phillips
Attorney, Agent, or Firm—William F. Noval

[57] ABSTRACT

A detection system for detecting and/or verifying the magnetic properties of the magnetic ink layer on common printed or copied documents includes, in order of interaction with the magnetic ink of a Document, a saturation record head, a saturation read head, a non-saturation record head, and a non-saturation read head. The disclosed method of operation is equivalent to the normal testing of the magnetic layer of a Document, but eliminates the need for an erase magnet.

16 Claims, 5 Drawing Sheets

APPARATUS AND METHOD FOR AUTHENTICATION OF DOCUMENTS PRINTED WITH MAGNETIC INK

FIELD OF INVENTION

This invention relates to the detection of magnetic fields, particularly magnetic fields emanating from documents printed with ink containing magnetic pigment.

BACKGROUND OF THE INVENTION

In the following, the term document is used to refer to any valuable sheet of paper or other body printed thereon with ink containing a magnetic pigment having specified magnetic properties.

In the related prior art, the magnetic field detection system used for the detection and verification of a common document uses a multi-head (5-head) process shown in FIG. 1. A Document 11 is transported in a direction shown by the Arrow in FIG. 1. The Document 11 first encounters a high frequency erase head 15. The high frequency erase head 15 demagnetizes the magnetic ink on the Document. Next the Document 11 is passed over a non-saturation record head 16 where the Note 11 is exposed to a field that magnetizes the ink to approximately 80% of saturation. The Note is next passed over non-saturation read head 17, the non-saturation read head detecting a remanent moment resulting from the application of the non-saturation magnetic field. The Note 11 is next passed over a saturation record head 18 which provides a field which magnetizes the magnetic ink layer to saturation. Finally, the Note 11 is passed over a saturation read head 19 which detects the saturation remanence moment resulting from application of the saturation magnetic field. The operation of the prior art testing method can be understood by reference to FIG. 2. FIG. 2 is a plot of the magnetization of the material versus the magnetic field, commonly called the hysteresis loop. The Document 11 first has an erase field applied thereto which results in the magnetic layer having the magnetic properties identified by point 21 of FIG. 2. When a non-saturation (80%) magnetic field is applied to the Document 11, the magnetic layer has the properties associated with a point 22 relative to the hysteresis curve 20. When the Document 11 is moved from the vicinity of the non-saturation magnetic record head, the magnetic properties (remanence moment) assume the properties defined by point 23. This remanence moment defined by point 23 is measured by the non-saturation magnetic field read head 17. Document 11 is then subjected to a saturation magnetic field and the field in the magnetic layer is shown by point 24 of FIG. 2. Once removed from the saturation magnetic field record head 18, the remanence magnetization at point 25 is measured by the saturation magnetic field read head 19. The measurements of the remanence field at point 23 and point 25 are used to authenticate the Document 11.

The conventional magnetic ink detection apparatus described above requires an erase head. A conventional erase head consists of a gapped magnetic core wound with many turns of wire. The wire carries a high frequency A.C. field. When the Document passes in the vicinity of the gap in the core, the Document is subject to a large alternating polarity magnetic field. The magnetic field experienced by the Document decays to zero as the Document moves away from the gap. The large alternating field erases any preexisting magnetization that can be present in the Document. As a result of the application of the decaying large alternating field, the layer of the Document is at point 21 of FIG. 2.

In certain apparatus used in the scanning of the Federal Reserve Documents, a ±1 mm tolerance in the Document to erase head separation is established and the Documents are scanned at 10 m/sec. In order to erase the preexisting magnetic field effectively, the A.C. erase field must be very large and be modulated with a high frequency. This large, high frequency field generates a significant noise signal in the read heads 17 and 19 of FIG. 1. The result of the generated noise, is that the signal to noise ratio is lowered.

Because of the large, high frequency current flowing in the turns of wire of the erase head, an unacceptable power can be dissipated by the erase head and excess heating can occur.

A need has therefore been felt for apparatus and a procedure which can eliminate the need for the erase head in a Document magnetic ink detection system.

SUMMARY OF THE INVENTION

The present invention is directed to overcoming one or more of the problems set forth above. Briefly summarized, according to one aspect of the present invention, the apparatus for detecting the magnetic ink on Documents includes, in the sequence with which the apparatus interacts with the Document, a saturation record head, a saturation read head, a non-saturation record head and a non-saturation read head. By proper selection of the fields applied to the Document, this procedure can provide information equivalent to or improved over the information provided by the prior art technique, but, however, without the need for an erase head.

These and other aspects, objects, features and advantages of the present invention will be more clearly understood and appreciated from a review of the following detailed description of the preferred embodiments and appended claims, and by reference to the accompanying drawings.

The present invention permits the magnetic ink on a Document to be detected and/or verified without requiring a bulky, noisy and power-consuming erase head.

DETAILED DESCRIPTION OF THE INVENTION

Figure 1:
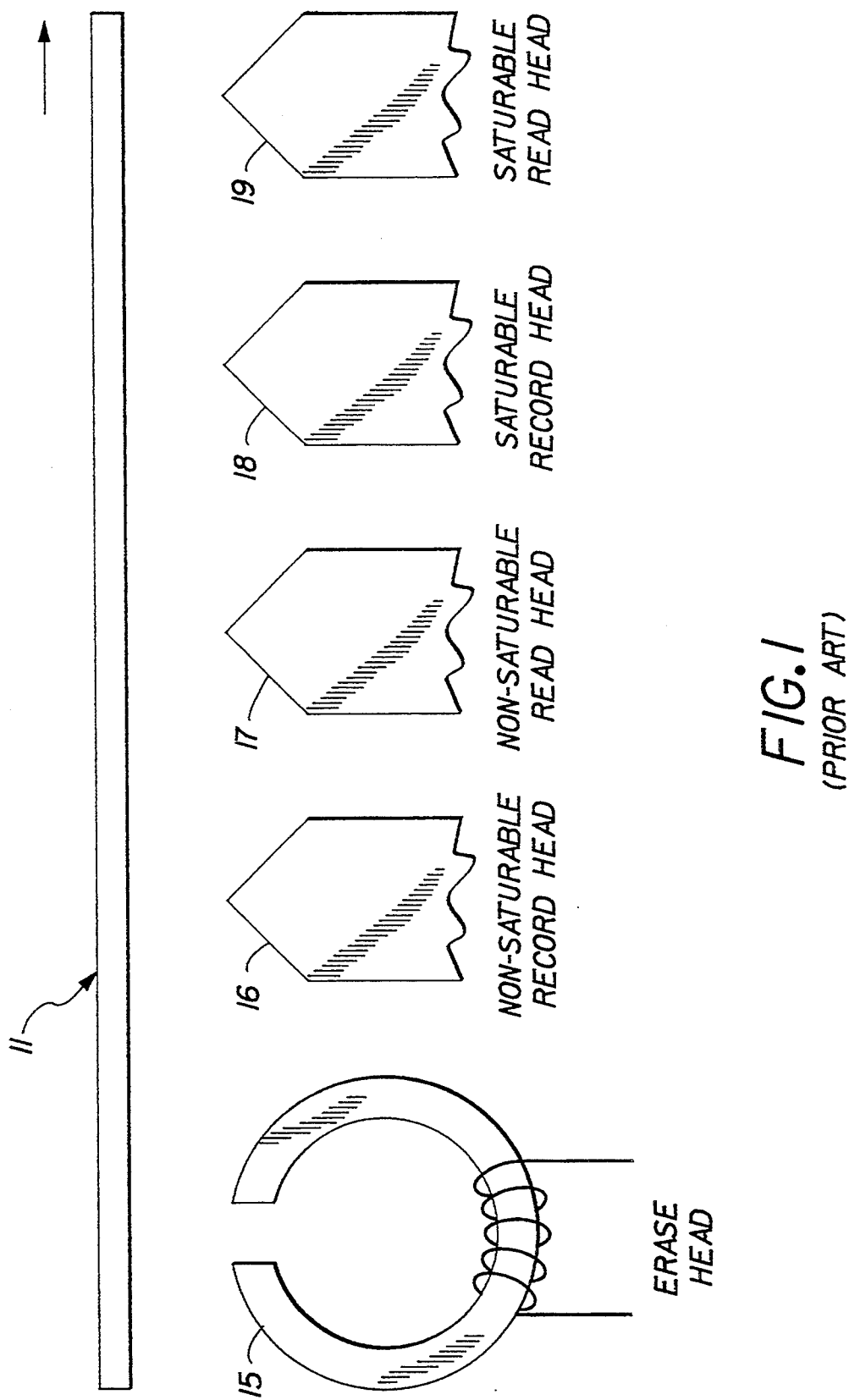
FIG. 1 is a block diagram of a magnetic field detection system used for the verification of documents according to the related art.
Figure 2:
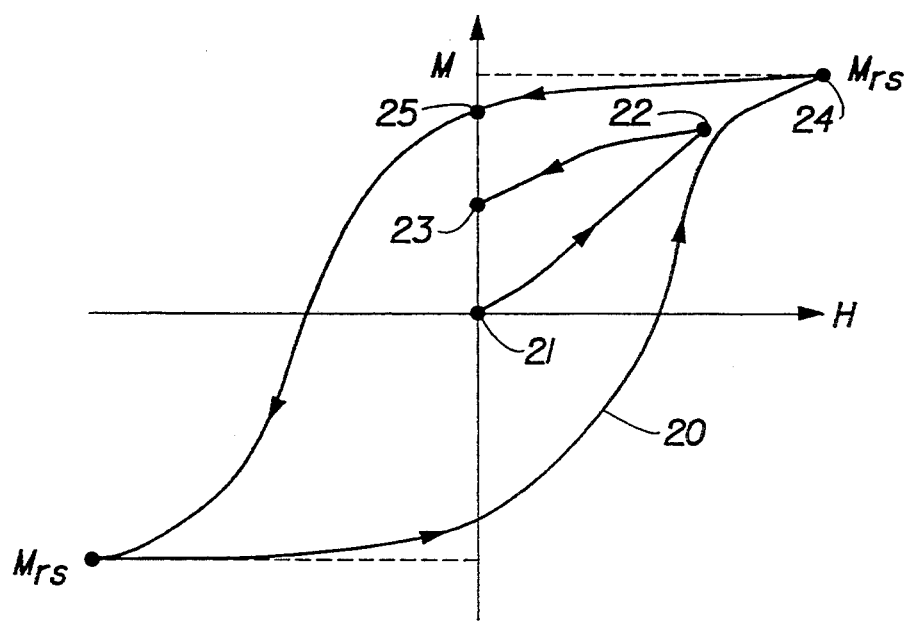
FIG. 2 illustrates the procedure for measuring parameters of a layer of magnetic material according to the prior art.
Figure 3:
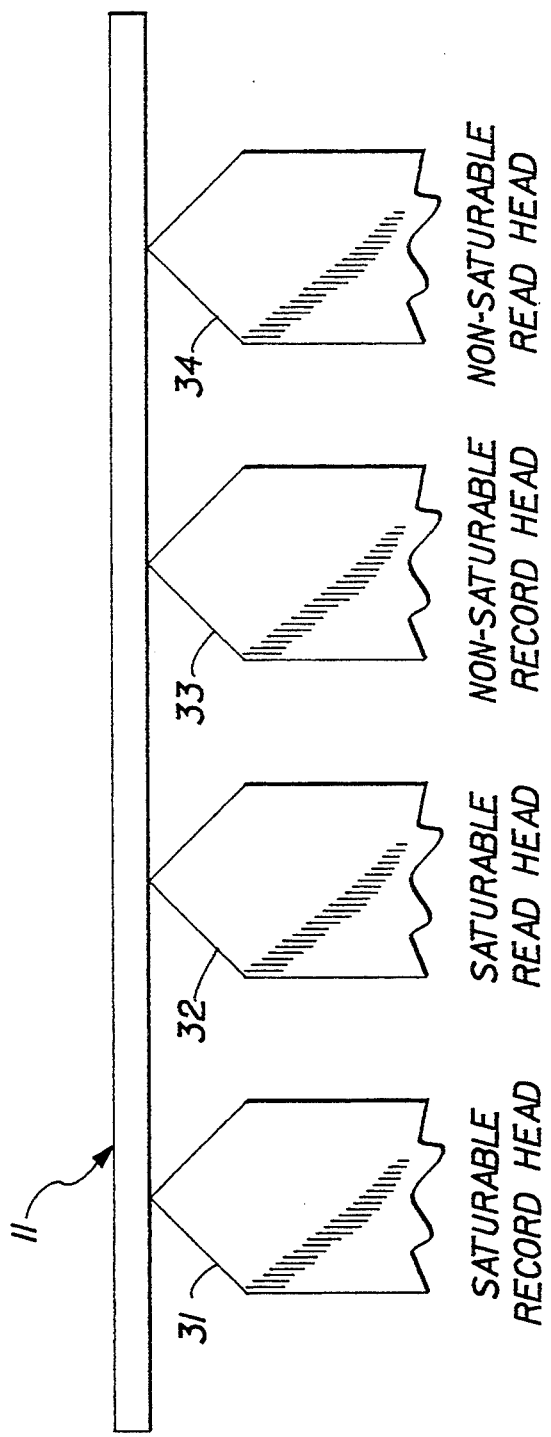
FIG. 3 is a block diagram of a magnetic field detection system according to the present invention.

Referring to FIG. 3, the detection system for the detection of the magnetic ink in a Federal reserve Note is shown. The detection system includes a saturation record head 31 which is the first element of the detection system to interact with the Note 11. The second element of the detection system to interact with the Note 11 is a saturation read head 32. Then, the interaction occurs with a non-saturation record head 33 and finally, the detection system interacts with the Document 11 by means of a non-saturation read head 34.

As indicated above, the prior art procedure for the determination of the magnetic properties of a magnetic layer is to erase the magnetic moment of the Note and then apply a magnetic field which is 80% of the saturation field. After application of this 80% field, the magnetic moment is measured. In the present invention, equivalent information can be obtained by applying a saturation field and then applying an opposite polarity magnetic field to the layer which is equivalent to the application of 80% (of saturation) magnetic field applied to the layer which has been erased. The basis of operation of the present invention is that, for low magnetic particle concentrations such as those found on a most printed documents, the magnetizing and demagnetizing particle switching field distributions are the same. The equivalence is expressed by the following (Wohlfarth) equation;

$$M_d(H) = 2M_r(H) - M_{rs} \quad (1)$$

where $M_r(H)$ is the remanent moment starting from zero, $M_d(H)$ is the demagnetizing remanent moment starting from $-M_{rs}$, and $M_{rs}$ is the saturation remanence of the particle assembly. Equation 1 can be written;

$$M_r(H) = \tfrac{1}{2}[M_{rs} - M_d(H)] \quad (2)$$

or $$M_r/M_{rs} = \tfrac{1}{2}(1 - M_d/M_{rs}). \quad (3)$$

From Equation 3, when $M_r(H)/M_{rs} = 0.8$, then $M_d(H)/M_{rs} = -0.6$. Therefore, if one applies a field large enough to provide $M_d/M_{rs} = -60\%$, this is equivalent to $M_r/M_{rs} = 80\%$.

Figure 4:
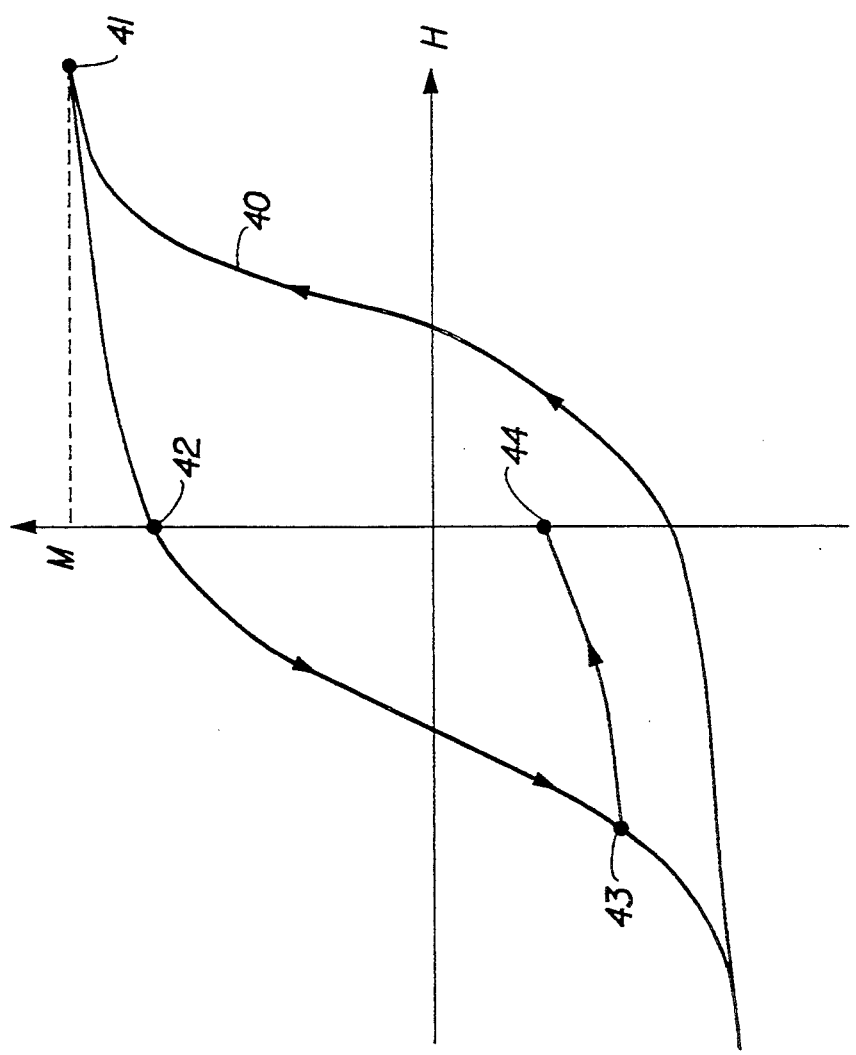
FIG. 4 illustrates the procedure for measuring parameters of a layer of magnetic material according to the present invention.

The operation of the magnetic head array, according to the present invention, can be understood by reference to FIG. 4. The saturation field magnetic head causes the magnetization M in the magnetic layer to reach a point 41 on hysteresis curve 40. When the Document is removed from the vicinity of the saturation record head, the saturation remanence field, measured by the saturation magnetic field read head is determined by point 42. The Note is moved to the vicinity of the non-saturation record head where the field in the magnetic layer and the magnetization are determined by point 43 on the hysteresis loop 40. When the Document is removed from the vicinity of the non-saturation record head, the non-saturation read head measures the remanence at point 44. This remanence is related to the remanence of the prior art procedure in the manner described above in Equation 3. The magnetic moment $M_{rs}$, measured by the saturation read head 32 of FIG. 3, and the demagnetizing magnetic moment measured by the non-saturation read head 34 of FIG. 3, are of opposite polarity, i.e., 180° out of phase, when the Document is genuine. When counterfeit Note is tested and the counterfeit Note a has high coercivity, i.e., is resistant to demagnetization, the moment of the counterfeit document may possibly be reduced to the proper 60% of saturation, but is not reversed in polarity. Provision can be made in the signal reproduction electronics to detect the phase of the non-saturated signal as well as its magnitude. In this manner, high coercivity counterfeit document can be identified and eliminated.

Figure 5:
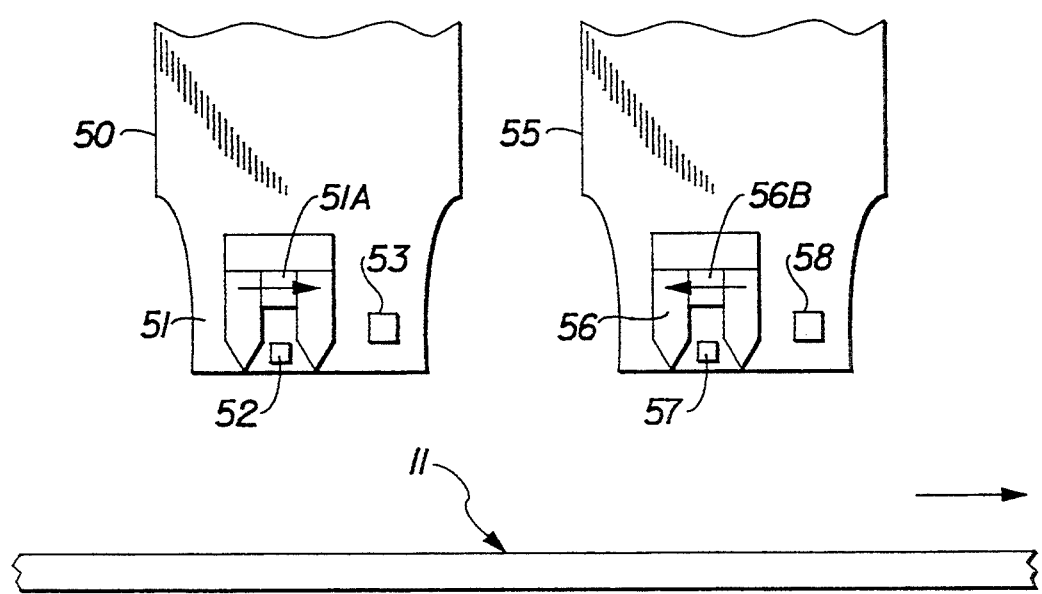
FIG. 5 is a more detailed block diagram of the preferred embodiment of the detection system according to the present invention.

Referring to FIG. 5, the configuration for the preferred embodiment of the magnetic head array is shown. A first combined head 50 includes elements 51 for producing the saturation magnetic field, a sensor 52 in the gap of elements 51 for detecting the saturation magnetic field, and a saturation read head 53 for detecting the remanent moment in the magnetic layer produced by the elements 51. The elements 51 include a permanent magnet 51A between soft magnetic material yokes. A second combined head 55 includes elements 56 for providing a non-saturating magnetic field in a direction opposite direction to that of the from the field of the first combined head, a sensor 57 located in the gap of the field producing elements 56 and a sensor 58 for detecting the remanence moment of the magnetic layer resulting the interaction of the first combined head 50 and second combined head 55. The elements 56 include a permanent magnet 56A between soft magnetic material yokes. The extra "in-field" detectors 52 and 57 of FIG. 5 measure the magnetization of the Document at points 41 and 43 of FIG. 4 and provide additional information to aid in the authentication.

The sensing principle of detectors 52 and 57 is that of magneto resistance. Thin films of 81/19 NiFe are located in the gaps of structures 51 and 56 so that the plane of the films are perpendicular to the large magnetic field at those points. Because the plane of the film is perpendicular to the large field, this field is not detected and the sensors can respond to the very small magnetic field emanating from the Documents with excellent signal to noise ratio. The other sensors 53 and 58 of FIG. 5 are also magneto-resistive sensors in the preferred embodiment.

While the invention has been described with particular reference to a preferred embodiment, it will be understood by those skilled in the art that various changes may be made and equivalents may be substituted for elements of the preferred embodiment without departing from invention. In addition, many modifications may be made to adapt to a particular situation and material to a teaching of the invention without departing from the essential teachings of the present invention. For example, while the verification of common documents printed with mildly magnetic inks has been emphasized, it will be clear that this technique can be applied to any magnetic layer.

As is evident from the foregoing description, certain aspects of the invention are not limited to the particular details of the example illustrated, and it is therefore contemplated that other modifications and applications will occur to those skilled in the art. It is accordingly intended that the claims shall cover all such modifications and applications as do not depart from the true spirit and scope of the invention.

PARTS LIST

11 Common printed document—printed with magnetic ink
15 high frequency erase head
16 non-saturation magnetic field record head
17 non-saturation magnetic field read head
18 saturation magnetic field record head
19 saturation magnetic field read head
20 hysteresis loop
21 magnetization in the magnetic layer after application of the erase field 22 magnetization in the magnetic layer relative to the hysteresis loop during application of the 80% of the saturation magnetic field
23 remanence magnetization in the magnetic layer after removal of the 80% of saturation field
24 magnetization in the magnetic layer during application of a saturation magnetic field
25 remanence magnetization after removal of the saturation field
31 saturation record head
32 saturation read head
33 non-saturation record head
34 non-saturation read head
40 hysteresis loop of the magnetic layer
41 magnetization during application of the saturation field
42 remanence after removal of the saturation field
43 magnetization during application of −60% of non-saturation field
44 remanence magnetization after removal of the 60% of non-saturation field
50 first combined head
51 saturation field producing elements
51A permanent magnet
52 saturation in field sensor
53 saturation field remanence sensor
55 second combined head
56 non-saturation field producing elements
56B permanent magnet
57 non-saturation in field sensor
58 non-saturation field remanence sensor

What is claimed Is:

1. A magnetic head array for detecting magnetic hysteresis properties of a magnetic layer, said array comprising:
    a first record head producing a D.C. magnetic field in said magnetic layer, said D.C. magnetic field having a strength sufficient to saturate said magnetic layer in a first direction;
    a first read head positioned proximate to and down stream from said first record head, said first read head detecting the phase and magnitude of remanent magnetization in said layer produced by said first record head;
    a second record head located proximate to and down stream from said first read head, said second record head producing a magnetic field in said magnetic layer which is opposite in direction to said D.C. magnetic field produced by said first record head, said magnetic field produced by said second record head demagnetizing said magnetic layer and partially magnetizing said layer in the opposite direction; and
    a second read head located proximate to said second record head, said second read head detecting a phase and magnitude of a remanent magnetization remaining in said magnetic layer after passing said second record head.

2. The magnetic head array of claim 1 wherein said first record head includes apparatus for detecting a phase and magnitude of a signal produced by said magnetic layer while said magnetic field is being applied to said magnetic layer.

3. The magnetic head array of claim 2 wherein said first read head is provided by a magneto resistive magnetic field sensing element in the gap of the record function elements.

4. The magnetic head array of claim 2 wherein a magneto motive force required to produce a magnetic record field is provided by a permanent magnet in the back region of a yoke constructed from a soft magnetic material.

5. The magnetic head array of claim 1 wherein said first and said second read heads include a magneto resistive magnetic field sensor.

6. The magnetic head array of claim 1 wherein said second record head is adapted to reverse the polarity and partially erase the magnetization of said magnetic layer, said second record head being adapted to detect a phase and a magnitude of the field produced by said magnetization in said magnetic layer.

7. The magnetic head array of claim 6 wherein said read function is provided by a magneto resistive magnetic field sensing element in a gap of said second record head.

8. The magnetic head array of claim 6 wherein a magneto motive force required to produce the magnetic record field is provided by a permanent magnet in the back gap region of a yoke constructed from a soft magnetic material.

9. The magnetic head array of claim 1 wherein the second read head is adapted to detect a phase and a magnitude of the field produced by said magnetic layer.

10. The magnetic head array of claim 1 wherein said magnetic printing material layer is the magnetic ink on a common printed or copied document.

11. A magnetic head array for detecting magnetic hysteresis properties of a magnetic layer, said array comprising:
    a first record head producing a D.C. magnetic field in the magnetic layer, said magnetic field being selected to saturate said magnetic layer in a first direction;
    a second record head located proximate said first record head, said second record head producing a magnetic field in said layer which is opposite in direction to the magnetic field produced by said first magnetic record head, said magnetic field produced by said second record head demagnetizing said magnetic layer and partially magnetizing said layer in the opposite direction;
    wherein both said first and said second record heads are adapted to simultaneously detect a phase and a magnitude of said magnetization on said magnetic layer.

12. The magnetic head array of claim 11 wherein said first and second read heads are magneto resistive magnetic field sensing elements in the gaps of said first and second record heads, respectively.

13. The magnetic head array of claim 11 wherein a magneto motive force required to produce magnetic record fields in said first and said second record heads are provided by permanent magnets in a back gap region of yokes made of a soft magnetic material.

14. The magnetic head array of claim 11 wherein said magnetic layer is the magnetic ink on a a printed or copied document.

15. A method for measuring magnetic hysteresis properties of a magnetic material layer, said method comprising the steps of:
    saturating the magnetic material layer in a first direction with a saturation magnetic field;
    measuring a saturation remanence of the layer after removal of the saturation magnetic field;

applying a non-saturation magnetic field having a predetermined value and a direction opposite to said saturation magnetic field; and measuring a magnitude and polarity of a non-saturation remanence of the magnetic layer after removal of the non-saturation magnetic field.

16. The method of claim 14 further comprising the step of:

comparing a magnitude and a phase of said saturation remanence value with a magnitude and a phase of said non-saturation remanence value.

* * * * *